(12) United States Patent
Khlat

(10) Patent No.: US 11,923,812 B2
(45) Date of Patent: Mar. 5, 2024

(54) DELAY-COMPENSATING POWER MANAGEMENT INTEGRATED CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 369 days.

(21) Appl. No.: 17/331,739

(22) Filed: May 27, 2021

(65) Prior Publication Data

US 2022/0052655 A1 Feb. 17, 2022

Related U.S. Application Data

(60) Provisional application No. 63/064,773, filed on Aug. 12, 2020.

(51) Int. Cl.
*H03F 1/30* (2006.01)
*H03F 3/195* (2006.01)
*H03F 3/24* (2006.01)

(52) U.S. Cl.
CPC ............ *H03F 3/195* (2013.01); *H03F 3/245* (2013.01); *H03F 2200/102* (2013.01); *H03F 2200/451* (2013.01)

(58) Field of Classification Search
CPC ..................................... H03F 1/30; H03G 3/20
USPC ......................................... 330/297, 129, 136
See application file for complete search history.

(56) References Cited

U.S. PATENT DOCUMENTS

| 8,093,945 | B2 | 1/2012 | Wimpenny |
| 8,159,309 | B1 | 4/2012 | Khlat et al. |
| 9,002,303 | B2 | 4/2015 | Brobston |
| 9,923,520 | B1 | 3/2018 | Abdelfattah et al. |
| 10,530,305 | B2 | 1/2020 | Folkmann et al. |
| 10,622,948 | B2* | 4/2020 | Khlat .............. H03F 3/189 |
| 10,680,559 | B2 | 6/2020 | Khlat et al. |
| 10,911,001 | B2* | 2/2021 | Khlat .............. H03F 1/0227 |

(Continued)

OTHER PUBLICATIONS

Wan et al. "Negative Group Delay Theory of a Four-Port RC-Network Feedback Operational Amplifier" IEEE Access, vol. 7, 2019, pp. 75708-75720.

(Continued)

*Primary Examiner* — Henry Choe
(74) *Attorney, Agent, or Firm* — Withrow & Terranova, P.L.L.C.

(57) ABSTRACT

A delay-compensating power management integrated circuit (PMIC) is provided. The PMIC includes a target voltage circuit configured to generate a target voltage that is utilized for generating a time-variant voltage to amplify an analog signal. The target voltage is generated based on a time-variant envelope of the analog signal but lags behind the time-variant envelope by a temporal delay(s) due to an inherent processing delay in the target voltage circuit. In this regard, a voltage processing circuit is provided in the target voltage circuit to generate a modified target voltage that is time-adjusted relative to the target voltage to substantially offset the temporal delay(s). By generating the time-variant voltage based on the modified target voltage, the time-variant voltage can be better aligned with the time-variant envelope of the analog signal, thus helping to reduce amplitude distortion when amplifying the analog signal.

20 Claims, 6 Drawing Sheets

(56) References Cited

U.S. PATENT DOCUMENTS

| | | | |
|---|---|---|---|
| 11,677,365 B2 * | 6/2023 | Khlat | ................... H03F 3/189 330/136 |
| 2007/0249304 A1 | 10/2007 | Snelgrove et al. | |
| 2012/0039487 A1 | 2/2012 | Sakai | |
| 2012/0302179 A1 | 11/2012 | Brobston et al. | |
| 2013/0076418 A1 | 3/2013 | Belitzer et al. | |
| 2014/0199949 A1 | 7/2014 | Nagode et al. | |
| 2014/0213196 A1 | 7/2014 | Langer et al. | |
| 2014/0266423 A1 | 9/2014 | Drogi et al. | |
| 2014/0361837 A1 | 12/2014 | Strange et al. | |
| 2016/0164550 A1 | 6/2016 | Pilgram | |
| 2016/0182100 A1 | 6/2016 | Menkhoff et al. | |
| 2016/0249300 A1 | 8/2016 | Tsai et al. | |
| 2016/0277045 A1 | 9/2016 | Langer | |
| 2017/0359784 A1 | 12/2017 | Kumar et al. | |
| 2018/0358942 A1 | 12/2018 | Hurwitz | |
| 2019/0215023 A1 | 7/2019 | Abouelenin | |
| 2021/0067097 A1 | 3/2021 | Wang et al. | |
| 2022/0115987 A1 * | 4/2022 | Granger-Jones | ........ H03F 3/245 |
| 2022/0115988 A1 * | 4/2022 | Khlat | ................... H03F 1/0222 |
| 2022/0116029 A1 * | 4/2022 | Khlat | ................... H03F 3/189 |
| 2022/0360229 A1 * | 11/2022 | Khlat | ................... H03F 1/0227 |
| 2023/0122151 A1 | 4/2023 | He et al. | |

OTHER PUBLICATIONS

Notice of Allowance for U.S. Appl. No. 17/331,756, dated Oct. 25, 2023, 8 pages.

Notice of Allowance for U.S. Appl. No. 17/351,667, dated Oct. 4, 2023, 8 pages.

Notice of Allowance for U.S. Appl. No. 17/351,695, dated Nov. 13, 2023, 8 pages.

Non-Final Office Action for U.S. Appl. No. 17/351,716, dated Dec. 6, 2023, 7 pages.

Notice of Allowance for U.S. Appl. No. 17/351,768, dated Oct. 20, 2023, 7 pages.

Notice of Allowance for U.S. Appl. No. 17/351,744, dated Jan. 4, 2024, 7 pages.

* cited by examiner

DELAY-COMPENSATING POWER MANAGEMENT INTEGRATED CIRCUIT

RELATED APPLICATIONS

This application claims the benefit of U.S. Provisional Patent Application Ser. No. 63/064,773 filed on Aug. 12, 2020, which is incorporated herein by reference in its entirety.

FIELD OF THE DISCLOSURE

The technology of the disclosure relates generally to a power management integrated circuit (PMIC).

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device employs a power amplifier(s) to amplify the RF signal(s) before transmitting in the mmWave RF spectrum.

Envelope tracking (ET) is a power management technique designed to improve operating efficiency of the power amplifier(s). Specifically, the power amplifier(s) is configured to amplify the RF signal(s) based on a time-variant voltage that closely tracks a time-variant power envelope of the RF signal(s). The time-variant voltage is typically generated by a power management circuit in the wireless communication device by first detecting the time-variant power envelop of the RF signal(s) and subsequently mapping the detected time-variant power envelope to a set of target voltage values prestored in a lookup table (LUT). Notably, the inherent processing delay associated with a power management circuit can inadvertently cause the time-variant voltage to lag behind the time-variant power envelope of the RF signal(s). As a result, the peaks of the time-variant voltage may become misaligned with the peaks of the time-variant power envelope, which may cause the power amplifier(s) to clip and distort the RF signal(s). In this regard, it is desirable to ensure that the power management circuit can maintain good alignment between the time-variant voltage and the time-variant power envelope of the RF signal(s).

SUMMARY

Aspects disclosed in the detailed description include a delay-compensating power management integrated circuit (PMIC). The PMIC includes a target voltage circuit configured to generate a target voltage that is utilized for generating a time-variant voltage to amplify an analog signal. The target voltage is generated based on a time-variant envelope of the analog signal but lags behind the time-variant envelope by a temporal delay(s) due to an inherent processing delay in the target voltage circuit. In this regard, a voltage processing circuit is provided in the target voltage circuit to generate a modified target voltage that is time-adjusted relative to the target voltage to substantially offset the temporal delay(s). By generating the time-variant voltage based on the modified target voltage, the time-variant voltage can be better aligned with the time-variant envelope of the analog signal, thus helping to reduce amplitude distortion when amplifying the analog signal.

In one aspect, a PMIC is provided. The PMIC includes a target voltage circuit. The target voltage circuit includes an envelope detector circuit. The envelope detector circuit is configured to detect a time-variant envelope of an analog signal. The detected time-variant envelope is delayed from the time-variant envelope of the analog signal by a first temporal delay. The target voltage circuit also includes an analog look-up table (LUT) circuit. The analog LUT circuit is configured to generate a target voltage based on the detected time-variant envelope of the analog signal. The target voltage is delayed from the detected time-variant envelope of the analog signal by a second temporal delay. The target voltage circuit includes a voltage processing circuit. The voltage processing circuit is configured to generate a modified target voltage that is time-adjusted relative to the time-variant envelope of the analog signal to thereby substantially offset at least the first temporal delay and the second temporal delay.

In another aspect, a PMIC is provided. The PMIC includes a target voltage circuit. The target voltage circuit includes an envelope detector circuit. The envelope detector circuit is configured to detect a time-variant envelope of an analog signal. The detected time-variant envelope is delayed from the time-variant envelope of the analog signal by a first temporal delay. The target voltage circuit also includes an analog LUT circuit. The analog LUT circuit is configured to generate a target voltage based on the detected time-variant envelope of the analog signal. The target voltage is delayed from the detected time-variant envelope of the analog signal by a second temporal delay. The target voltage circuit includes a voltage processing circuit. The voltage processing circuit is configured to generate a modified target voltage that is time-adjusted relative to the time-variant envelope of the analog signal to thereby substantially offset at least the first temporal delay and the second temporal delay. The PMIC also includes an envelope tracking integrated circuit (ETIC). The ETIC is configured to generate a time-variant voltage based on the modified target voltage for amplifying the analog signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1A:
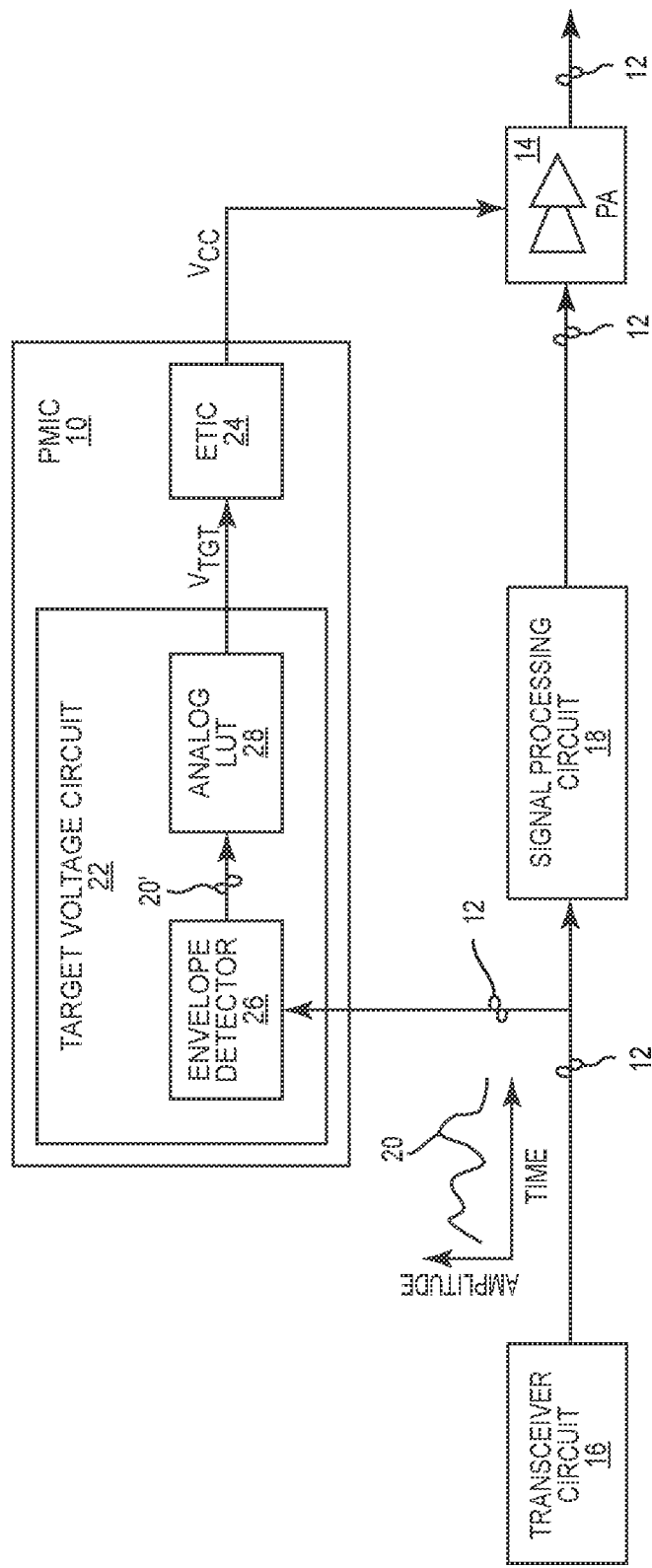
FIG. 1A is a schematic diagram of an exemplary existing power management integrated circuit (PMIC) that may cause amplitude distortion in an analog signal as a result of an inherent processing delay in the existing PMIC.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a delay-compensating power management integrated circuit (PMIC). The PMIC includes a target voltage circuit configured to generate a target voltage that is utilized for generating a time-variant voltage to amplify an analog signal. The target voltage is generated based on a time-variant envelope of the analog signal but lags behind the time-variant envelope by a temporal delay(s) due to inherent processing delay in the target voltage circuit. In this regard, a voltage processing circuit is provided in the target voltage circuit to generate a modified target voltage that is time-adjusted relative to the target voltage to substantially offset the temporal delay(s). By generating the time-variant voltage based on the modified target voltage, the time-variant voltage can be better aligned with the time-variant envelope of the analog signal, thus helping to reduce amplitude distortion when amplifying the analog signal.

Figure 1B:
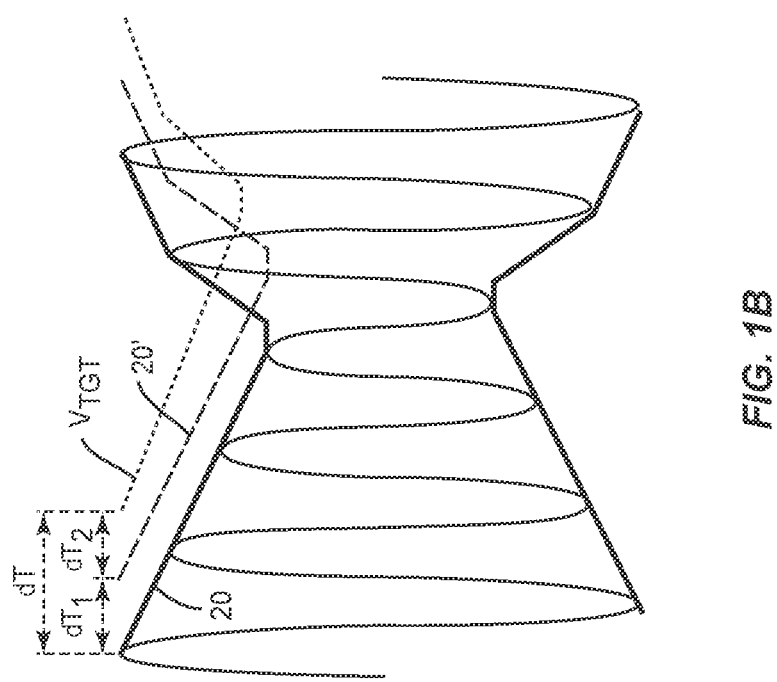
FIG. 1B is a graphic diagram providing an exemplary illustration of a temporal delay between a time-variant envelope of the analog signal and a target voltage caused by the inherent processing delay in the existing PMIC of FIG. 1A.
Figure 1C:
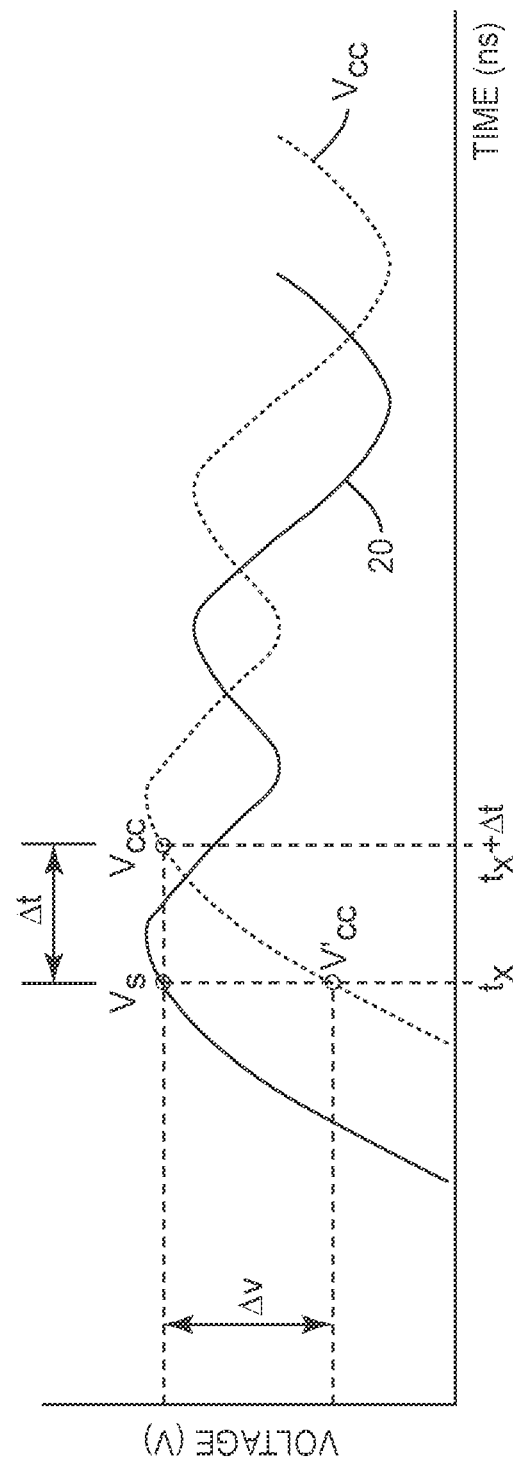
FIG. 1C is a graphic diagram providing an exemplary illustration as to how the inherent processing delay in the existing PMIC of FIG. 1A can cause the amplitude distortion in the analog signal.
Figure 2:
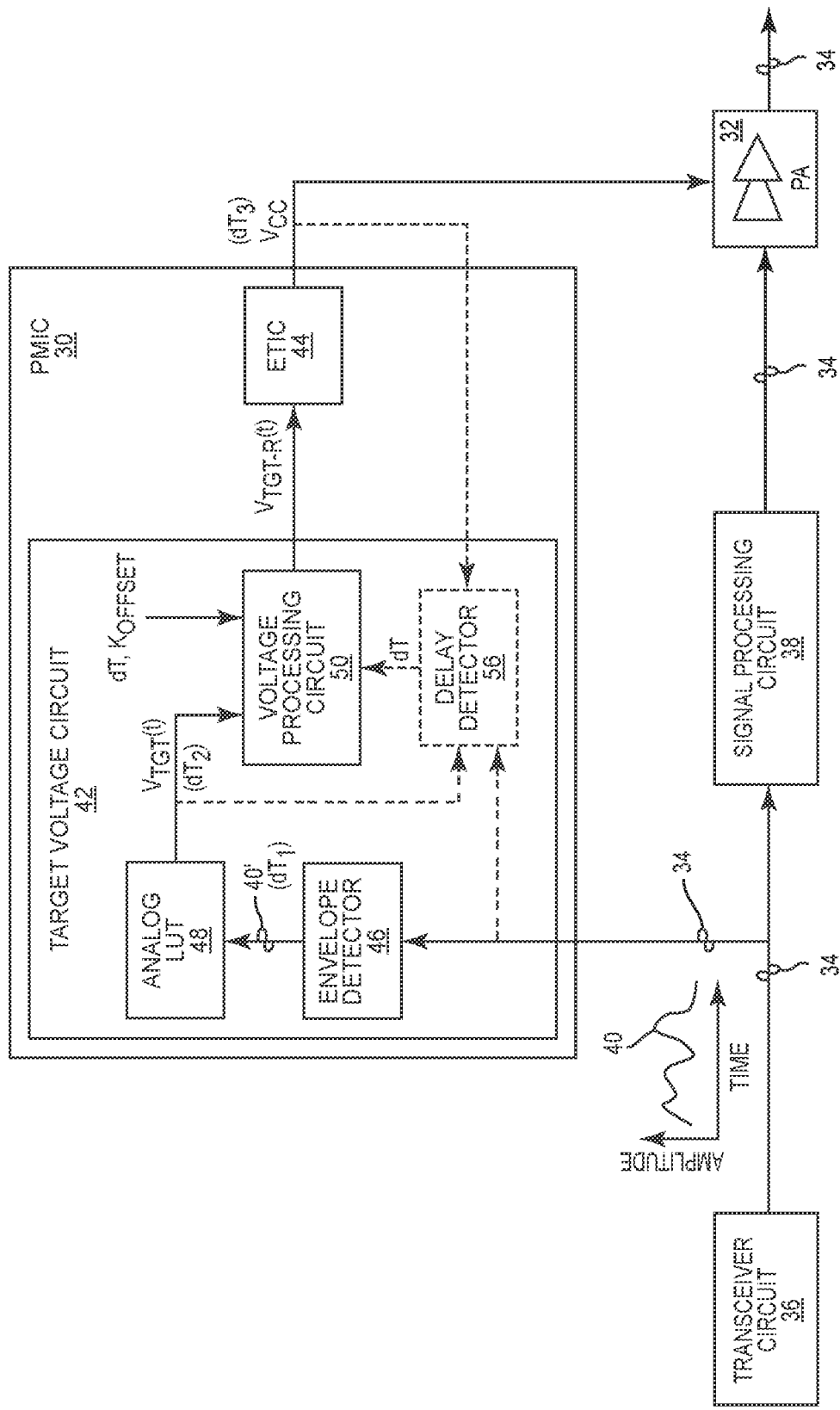
FIG. 2 is a schematic diagram of an exemplary PMIC configured according to embodiments of the present disclosure to offset various temporal delays incurred in the PMIC.

Before discussing a PMIC of the present disclosure, starting at FIG. 2, a brief overview of an existing PMIC that may cause amplitude distortion in an analog signal as a result of inherent processing delay associated with the existing PMIC is first provided with reference to FIGS. 1A-1C.

FIG. 1A is a schematic diagram of an exemplary existing PMIC 10 that that may cause amplitude distortion in an analog signal 12 as a result of an inherent processing delay in the existing PMIC 10. The existing PMIC 10 is configured to provide a time-variant voltage $V_{CC}$ to a power amplifier 14 for amplifying the analog signal 12. The analog signal 12 may be generated by a transceiver circuit 16 and provided to a signal processing circuit 18 in an intermediate frequency (IF). The signal processing circuit 18 may upconvert the analog signal 12 from the IF to a carrier frequency and provide the analog signal 12 to the power amplifier 14 for amplification.

The analog signal 12 is associated with a time-variant envelope 20 that rises and falls over time. Thus, to prevent potential amplitude distortion in the analog signal 12 and ensure higher operating efficiency of the power amplifier 14, it is necessary for the existing PMIC 10 to generate the time-variant voltage $V_{CC}$ to closely track the time-variant envelope 20.

In other words, the time-variant voltage $V_{CC}$ needs to be aligned with the time-variant envelope 20 as closely as possible. As such, the existing PMIC 10 is configured to include a target voltage circuit 22 and an envelope tracking (ET) integrated circuit (ETIC) 24. The target voltage circuit 22 includes an envelope detector circuit 26 and an analog lookup table (LUT) circuit 28. The envelope detector circuit 26 is configured to detect the time-variant envelope 20 of the analog signal 12 and provide a detected time-variant envelope 20' to the analog LUT circuit 28. The analog LUT circuit 28 is configured to generate a target voltage $V_{TGT}$ from the detected time-variant envelope 20' and provide the target voltage $V_{TGT}$ to the ETIC 24. The ETIC 24, in turn, generates the time-variant voltage $V_{CC}$ based on the target voltage $V_{TGT}$.

In this regard, since the target voltage $V_{TGT}$ tracks the detected time-variant envelope 20' and the time-variant voltage $V_{CC}$ tracks the target voltage $V_{TGT}$, the time-variant voltage $V_{CC}$ will end up rising and falling along with the time-variant envelope 20. Notably, the envelope detector circuit 26 and the analog LUT circuit 28 can cause an inherent processing delay. As a result, as shown in FIG. 1B, the detected time-variant envelope 20' will lag behind the time-variant envelope 20 associated with the analog signal 12 and the target voltage $V_{TGT}$ will lag behind the detected time-variant envelope 20'.

FIG. 1B is a graphic diagram providing an exemplary illustration of a temporal delay dT between the time-variant envelope 20 of the analog signal 12 and the target voltage $V_{TGT}$ caused by the inherent processing delay in the existing PMIC 10 of FIG. 1A. Common elements between FIGS. 1A and 1B are shown therein with common element numbers and will not be re-described herein.

As shown in FIG. 1B, the detected time-variant envelope 20' is delayed from the time-variant envelope 20 of the analog signal 12 by a first temporal delay $dT_1$, and the target voltage $V_{TGT}$ is delayed from the detected time-variant envelope 20' by a second temporal delay $dT_2$. The temporal delay dT, coupled with the inherent processing delay of the ETIC 24, can further delay the time-variant voltage $V_{CC}$ from the time-variant envelope 20 of the analog signal 12.

As illustrated in FIG. 1C, the misalignment between the time-variant voltage $V_{CC}$ and the time-variant envelope 20 of the analog signal 12 can cause amplitude distortion in the analog signal 12. FIG. 1C is a graphic diagram providing an exemplary illustration as to how the inherent processing delay in the existing PMIC 10 of FIG. 1A can cause amplitude distortion in the analog signal 12.

If the time-variant envelope 20 and the time-variant voltage $V_{CC}$ are perfectly aligned, an instantaneous amplitude of the analog signal 12 (not shown), which is represented by a voltage $V_S$, would substantially equal the time-variant voltage $V_{CC}$ at time $t_x$. However, as shown in FIG. 1C, the time-variant voltage $V_{CC}$ lags behind the time-variant envelope 20 by a temporal delay Δt. As such, at time $t_x$, the power amplifier 14 (not shown) receives a lower voltage $V'_{CC}$, instead of the time-variant voltage $V_{CC}$. In this regard, the time-variant voltage $V_{CC}$ deviates from the time-variant envelope 20 by a voltage differential Δv at time $t_x$. Consequently, the power amplifier 14 may clip the analog signal 12 to cause an amplitude distortion. As such, it is desirable to reduce the misalignment between the time-variant voltage $V_{CC}$ and the time-variant envelope 20 of the analog signal 12 as much as possible.

In this regard, FIG. 2 is a schematic diagram of an exemplary PMIC 30 configured according to embodiments of the present disclosure to offset various temporal delays incurred in the PMIC 30.

The PMIC 30 is configured to provide a time-variant voltage $V_{CC}$ to a power amplifier 32 for amplifying an analog signal 34. The analog signal 34 may be generated by a transceiver circuit 36 and provided to a signal processing circuit 38 in the IF. The signal processing circuit 38 may upconvert the analog signal 34 from the IF to a carrier frequency and provide the analog signal 34 to the power amplifier 32 for amplification.

The analog signal 34 is associated with a time-variant envelope 40 that rises and falls over time. Thus, to prevent potential amplitude distortion in the analog signal 34 and ensure higher operating efficiency of the power amplifier 32, it is necessary to generate the time-variant voltage $V_{CC}$ to closely track the time-variant envelope 20.

In this regard, the PMIC 30 is configured to include a target voltage circuit 42. As discussed below, the target voltage circuit 42 is configured to generate a modified target voltage $V_{TGT\text{-}R}(t)$ that is time-adjusted relative to the time-variant envelope 40 of the analog signal 34 to offset a temporal delay(s) incurred in the target voltage circuit 42. Herein, a first signal is said to be time-adjusted relative to a second signal when the first signal is moved forward in time to eliminate a temporal delay from the second signal. Accordingly, an ETIC 44 in the PMIC 30 can generate a time-variant voltage $V_{CC}$ based on the modified target voltage $V_{TGT\text{-}R}(t)$ and provide the time-variant voltage $V_{CC}$ to the power amplifier 32 for amplifying the analog signal 34. Since the modified target voltage $V_{TGT\text{-}R}(t)$ is better aligned with the time-variant envelope 40, the time-variant voltage $V_{CC}$ will be better aligned with the time-variant envelope 40 as a result. Therefore, it is possible to reduce or even avoid potential amplitude distortion to the analog signal 34 during amplification.

In a non-limiting example, the target voltage circuit 42 includes an envelope detector circuit 46 and an analog LUT circuit 48. The envelope detector circuit 46 is configured to detect the time-variant envelope 40 of the analog signal 34 and provide a detected time-variant envelope 40' to the analog LUT circuit 48. The analog LUT circuit 48 is configured to generate a target voltage $V_{TGT}(t)$ based on the detected time-variant envelope 40' of the analog signal 34. Like the envelope detector circuit 26 and the analog LUT circuit 28 in the existing PMIC 10 of FIG. 1A, the envelope detector circuit 46 and the analog LUT circuit 48 can each cause certain processing delays. As a result, the detected time-variant envelope 40' may be delayed from the time-variant envelope 40 of the analog signal 34 by a first temporal delay $dT_1$ and the target voltage $V_{TGT}(t)$ may be delayed from the detected time-variant envelope 40' by a second temporal delay $dT_2$.

Figure 3:
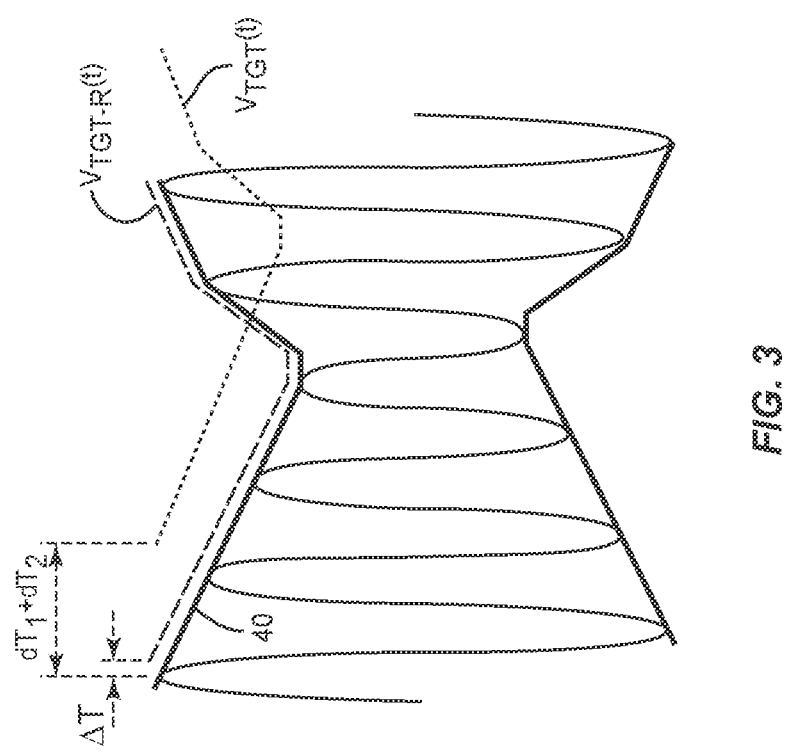
FIG. 3 is a graphic diagram providing an exemplary illustration of a modified target voltage that is time-adjusted relative to a time-variant envelope to substantially offset a temporal delay(s)

In an embodiment, the target voltage circuit 42 is configured to include a voltage processing circuit 50, which can be a field-programmable gate array (FPGA), as an example. In a non-limiting example, the voltage processing circuit 50, the envelope detector circuit 46, and the analog LUT circuit 48 can all be integrated into a single circuit (e.g., an FPGA). As shown in FIG. 3, the voltage processing circuit 50 is configured to generate the modified target voltage $V_{TGT}(t)\text{-}_R(t)$, which is time-adjusted relative to the time-variant envelope 40 of the analog signal to offset at least the first temporal delay $dT_1$ and the second temporal delay $dT_2$.

FIG. 3 is a graphic diagram providing an exemplary illustration of the modified target voltage $V_{TGT\text{-}R}(t)$ that is time-adjusted relative to the time-variant envelope 40 to substantially offset the first temporal delay $dT_1$ and the second temporal delay $dT_2$. Common elements between FIGS. 2 and 3 are shown therein with common element numbers and will not be re-described herein.

As shown in FIG. 3, the target voltage $V_{TGT}(t)$ as originally generated by the analog LUT circuit 48 lags behind the time-variant envelope 40 by a sum of the first temporal delay $dT_1$ and the second temporal delay $dT_2$. In contrast, the modified target voltage $V_{TGT-R}(t)$ is time-adjusted to substantially offset the first temporal delay $dT_1$ and the second temporal delay $dT_2$ to thereby be better aligned with the time-variant envelope 40. Herein, the modified target voltage $V_{TGT-R}(t)$ is said to substantially offset the first temporal delay $dT_1$ and the second temporal delay $dT_2$ when a temporal gap $\Delta T$ between the modified target voltage $V_{TGT-R}(t)$ and the time-variant envelope 40 is less than 10% of the sum of the first temporal delay $dT_1$ and the second temporal delay $dT_2$. As a result of improved alignment with the time-variant envelope 40, it is possible to reduce or even avoid amplitude distortion at the power amplifier 32.

With reference back to FIG. 2, the voltage processing circuit 50 can be configured to generate the modified target voltage $V_{TGT-R}(t)$ from the target voltage $V_{TGT}(t)$ and as a function of a modulated modifier $K_{MOD}(t)$. In a non-limiting example, the modified target voltage $V_{TGT-R}(t)$ can be described by the equation (Eq. 1) below.

$$V_{TGT-R}(t)=V_{TGT}(t)+K_{MOD}(t)*(V_{TGTMAX}-V_{TGT}(t)) \quad (Eq.\ 1)$$

In the equation (Eq. 1) above, $K_{MOD}(t)$ represents the modulated modifier and $V_{TGTMAX}$ represents an estimated maximum value of the target voltage $V_{TGT}(t)$. The voltage processing circuit 50 can be configured to generate the modulated modifier $K_{MOD}(t)$ as a function of a linear term $K_{MODLINEAR}(t)$ and a nonlinear term $NL_{GAIN}(dV_{TGT}(t)/dt)$. In a non-limiting example, the modulated modifier $K_{MOD}(t)$ can be described by the equation (Eq. 2) below.

$$K_{MOD}(t)=K_{MODLINEAR}(t)*NL_{GAIN}(dV_{TGT}(t)/dt) \quad (Eq.\ 2)$$

The voltage processing circuit 50 can be configured to determine the linear term $K_{MODLINEAR}(t)$ as a function of a delay budget $dT$ and a voltage offset $K_{OFFSET}(dT)$ corresponding to the delay budget $dT$. In this regard, in case the voltage processing circuit 50 is configured to generate the modified target voltage $V_{TGT-R}(t)$ to substantially offset the first temporal delay $dT_1$ and the second temporal delay $dT_2$, the delay budget $dT$ may be set to the sum of the first temporal delay $dT_1$ and the second temporal delay $dT_2$ ($dT=dT_1+dT_2$). Although the delay budget $dT$ is shown herein as a positive number, it should be appreciated that the delay budget can also be a negative number to thereby cause the modified target voltage $V_{TGT-R}(t)$ to be further delayed. In a non-limiting example, the linear term $K_{MODLINEAR}(t)$ can be described by the equation (Eq. 3) below.

$$K_{MODLINEAR}(t)=K_{OFFSET}(dT)+[dV_{TGT}(t)/dt]*dT/[V_{TGTMAX}-V_{TGT}(t)] \quad (Eq.\ 3)$$

Figure 4:
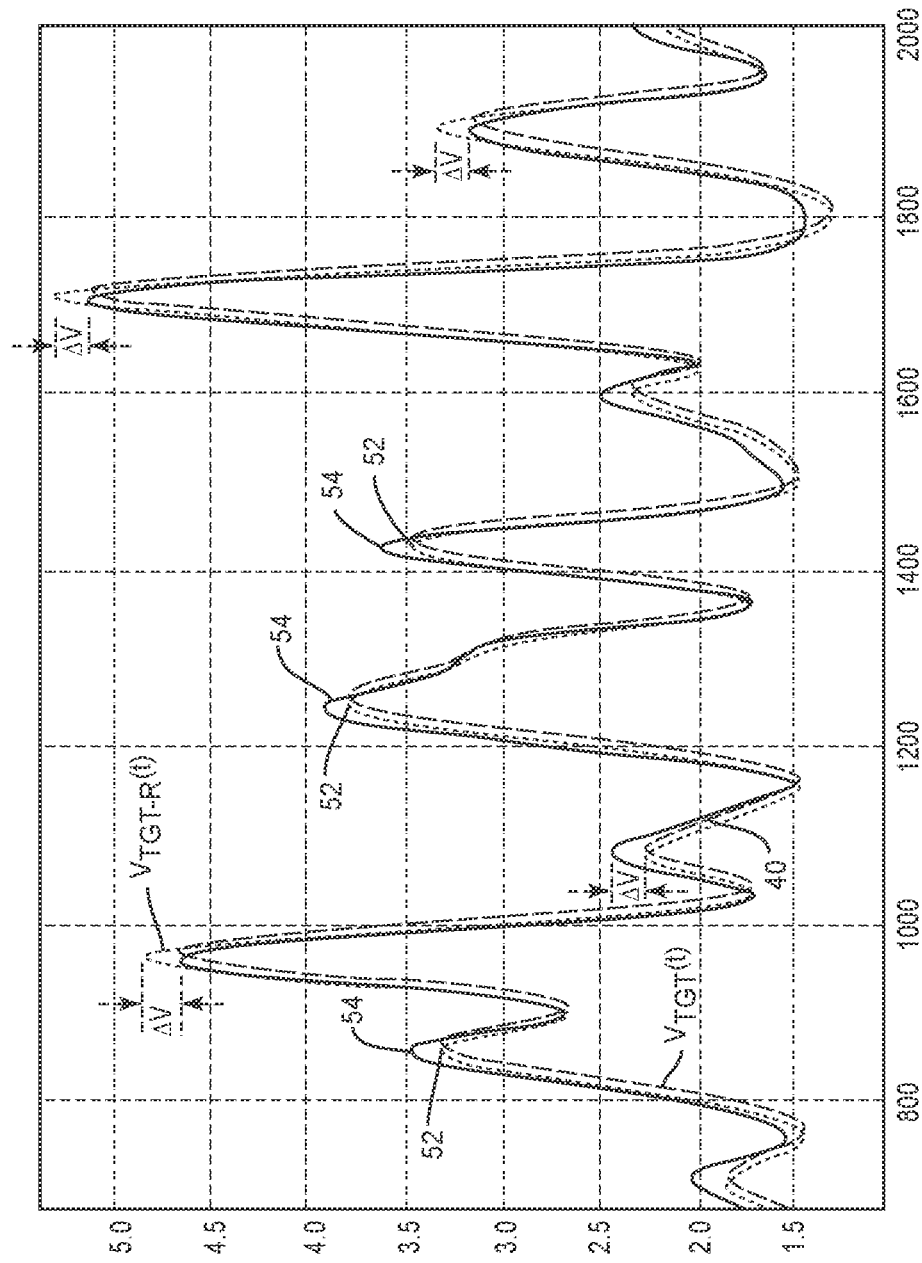
FIG. 4 is a graphic diagram providing an exemplary illustration of a voltage headroom between the modified target voltage and the time-variant envelope of FIG. 3.

In one embodiment, the delay budget $dT$ and the voltage offset $K_{OFFSET}(dT)$ corresponding to the delay budget $dT$ can be predetermined and stored in the voltage processing circuit 50. As shown in FIG. 4, the voltage offset $K_{OFFSET}(dT)$ may be so determined to provide a voltage headroom $\Delta V$ between peaks of the modified target voltage $V_{TGT-R}(t)$ and peaks of the time-variant envelope 40 of the analog signal 34. FIG. 4 is a graphic diagram providing an exemplary illustration of the voltage headroom $\Delta V$ as created by the voltage offset $K_{OFFSET}(dT)$ in the equation (Eq. 3).

Notably, the time-variant envelope 40 can have a number of amplitude peaks 52 and the modified target voltage VTGT-R(t) can have a number of voltage peaks 54 each corresponding to a respective one of the amplitude peaks 52. In this regard, the voltage offset $K_{OFFSET}(dT)$ is determined to cause each of the voltage peaks 54 to be higher than the respective one of the amplitude peaks 52 by the voltage headroom $\Delta V$. By creating the voltage headroom $\Delta V$ between the modified target voltage $V_{TGT-R}(t)$ and the time-variant envelope 40, it is possible to ensure that the ETIC 44 can always generate the time-variant voltage $V_{CC}$ sufficient enough to avoid amplitude distortion in the analog signal 34.

With reference back to FIG. 2, the nonlinear term $NL_{GAIN}(dV_{TGT}(t)/dt)$ is introduced in the equation (Eq. 2) to ensure that the voltage headroom $\Delta V$ created by the voltage offset $K_{OFFSET}(dT)$ in the linear term $K_{MODLINEAR}(t)$ is not excessively high to cause linearity degradation in the power amplifier 32. In a non-limiting example, the nonlinear term $NL_{GAIN}(dV_{TGT}(t)/dt)$ is a function that is equal to one (1) for most $dV_{TGT}(t)/dt$ or less than 1 when $dV_{TGT}(t)/dt$ approaches a maximum or a minimum. As a result, the voltage headroom $\Delta V$ can be maintained when the nonlinear term $NL_{GAIN}(dV_{TGT}(t)/dt)$ is equal to 1 or reduced when the nonlinear term $NL_{GAIN}(dV_{TGT}(t)/dt)$ is less than 1.

Alternative to predetermining and storing the delay budget $dT$ in the voltage processing circuit 50, the target voltage circuit 42 may be configured to include a delay detector circuit 56 to dynamically determine the first temporal delay $dT_1$ and the second temporal delay $dT_2$. Accordingly, the delay detector circuit 56 to provide the determined first temporal delay $dT_1$ and the determined second temporal delay $dT_2$ to the voltage processing circuit 50 for generating the modified target voltage $V_{TGT-R}(t)$.

The analog LUT circuit 48 may be configured to store multiple analog LUTs (not shown). For example, the analog LUT circuit 48 can store an average power tracking (APT) LUT that correlates the time-variant envelope 40 of the analog signal 34 with a constant target voltage corresponding to an average power of the analog signal 34. The analog LUT circuit 48 can also store an envelope tracking (ET) LUT that correlates the time-variant envelope 40 of the analog signal 34 with a time-variant target voltage that tracks the time-variant envelope 40 of the analog signal. In this regard, the analog LUT circuit 48 may be configured to generate the target voltage as an APT target voltage based on the APT LUT or as an ET target voltage based on the ET LUT.

Like the envelope detector circuit 46 and the analog LUT circuit 48, the ETIC 44 can also introduce a certain processing delay to cause the time-variant voltage $V_{CC}$ to lag behind the target voltage $V_{TGT}(t)$ by a third temporal delay $dT_3$. In this regard, in another embodiment, the voltage processing circuit 50 can be configured to offset the third temporal delay $dT_3$ in addition to offsetting the first temporal delay $dT_1$ and the second temporal delay $dT_2$.

In this regard, the delay budget $dT$ can be so determined to include the first temporal delay $dT_1$, the second temporal delay $dT_2$, and the third temporal delay $dT_3$ ($dT=dT_1+dT_2+dT_3$). Accordingly, the voltage processing circuit 50 can be further configured to generate the modified target voltage $V_{TGT-R}(t)$ that is time-adjusted to offset the first temporal delay $dT_1$, the second temporal delay $dT_2$, and the third temporal delay $dT_3$ in accordance with the equations (Eq. 1, Eq. 2, and Eq. 3). The delay budget $dT$ may be predetermined and stored in the voltage processing circuit 50 or dynamically determined by the delay detector circuit 56.

Those skilled in the art will recognize improvements and modifications to the embodiments of the present disclosure. All such improvements and modifications are considered within the scope of the concepts disclosed herein and the claims that follow.

What is claimed is:

1. A power management integrated circuit (PMIC) comprising:
a target voltage circuit comprising:
an envelope detector circuit configured to detect a time-variant envelope of an analog signal, wherein the detected time-variant envelope is delayed from the time-variant envelope of the analog signal by a first temporal delay;
an analog look-up table (LUT) circuit configured to generate a target voltage based on the detected time-variant envelope of the analog signal, wherein the target voltage is delayed from the detected time-variant envelope of the analog signal by a second temporal delay; and
a voltage processing circuit configured to generate a modified target voltage that is time-adjusted relative to the time-variant envelope of the analog signal to thereby substantially offset at least the first temporal delay and the second temporal delay.

2. The PMIC of claim 1 wherein the first temporal delay and the second temporal delay are predetermined and stored in the voltage processing circuit.

3. The PMIC of claim 1 wherein the target voltage circuit further comprises a delay detector circuit configured to:
dynamically determine the first temporal delay and the second temporal delay; and
provide the determined first temporal delay and the determined second temporal delay to the voltage processing circuit.

4. The PMIC of claim 1 wherein the analog LUT circuit comprises:
an average power tracking (APT) LUT that correlates the time-variant envelope of the analog signal with a constant target voltage corresponding to an average power of the analog signal; and
an envelope tracking (ET) LUT that correlates the time-variant envelope of the analog signal with a time-variant target voltage that tracks the time-variant envelope of the analog signal.

5. The PMIC of claim 4 wherein the analog LUT circuit is further configured to generate the target voltage based on one of the APT LUT and the ET LUT.

6. The PMIC of claim 1 wherein the voltage processing circuit is further configured to generate the modified target voltage as a function of a modulated modifier.

7. The PMIC of claim 6 wherein the voltage processing circuit is further configured to generate the modified target voltage based on an equation expressed as:

$$V_{TGT-R}(t)=V_{TGT}(t)+K_{MOD}(t)*(V_{TGTMAX}-V_{TGT}(t));$$

wherein:
$V_{TGT-R}(t)$ represents the modified target voltage;
$V_{TGT}(t)$ represents the target voltage generated by the analog LUT circuit;
$K_{MOD}(t)$ represents the modulated modifier; and
$V_{TGTMAX}$ represents an estimated maximum value of the target voltage $V_{TGT}(t)$.

8. The PMIC of claim 6 wherein the voltage processing circuit is further configured to determine the modulated modifier as a function of a linear term and a nonlinear term.

9. The PMIC of claim 8 wherein the voltage processing circuit is further configured to determine the modulated modifier based on an equation expressed as:

$$K_{MOD}(t)=K_{MODLINEAR}(t)*NL_{GAIN}(dV_{TGT}(t)/dt);$$

wherein:
$K_{MOD}(t)$ represents the modulated modifier;
$K_{MODLINEAR}(t)$ represents the linear term; and
$NL_{GAIN}(dV_{TGT}(t)/dt)$ represents the nonlinear term.

10. The PMIC of claim 8 wherein the voltage processing circuit is further configured to determine the linear term as a function of a delay budget and a voltage offset corresponding to the delay budget.

11. The PMIC of claim 10 wherein the delay budget comprises at least the first temporal delay and the second temporal delay.

12. The PMIC of claim 11 wherein the voltage offset is predetermined based on the delay budget and stored in the voltage processing circuit.

13. The PMIC of claim 10 wherein the voltage processing circuit is further configured to determine the linear term based on an equation expressed as:

$$K_{MODLINEAR}(t)=K_{OFFSET}(dT)+[dV_{TGT}(t)/dt]*dT/[V_{TGTMAX}-V_{TGT}(t)];$$

wherein:
$K_{MODLINEAR}(t)$ represents the linear term;
$dT$ represents the delay budget;
$K_{OFFSET}(dT)$ represents the voltage offset corresponding to the delay budget;
$V_{TGT}(t)$ represents the target voltage generated by the analog LUT circuit; and
$V_{TGTMAX}$ represents an estimated maximum value of the target voltage $V_{TGT}(t)$.

14. The PMIC of claim 10 wherein:
the time-variant envelope of the analog signal comprises a plurality of amplitude peaks;
the modified target voltage comprises a plurality of voltage peaks each corresponding to a respective one of the plurality of amplitude peaks; and
the voltage offset is selected to cause each of the plurality of voltage peaks to be higher than the respective one of the plurality of amplitude peaks.

15. The PMIC of claim 1 further comprising an envelope tracking integrated circuit (ETIC) configured to generate a time-variant voltage for amplifying the analog signal, wherein the time-variant voltage is delayed from the target voltage by a third temporal delay.

16. The PMIC of claim 15 wherein the voltage processing circuit is further configured to generate the modified target voltage that is time-adjusted to offset the first temporal delay, the second temporal delay, and the third temporal delay.

17. The PMIC of claim 16 wherein the first temporal delay, the second temporal delay, and the third temporal delay are predetermined and stored in the voltage processing circuit.

18. The PMIC of claim 16 wherein the target voltage circuit further comprises a delay detector circuit configured to:
dynamically determine the first temporal delay, the second temporal delay, and the third temporal delay; and
provide the determined first temporal delay, the determined second temporal delay, and the determined third temporal delay to the voltage processing circuit.

19. The PMIC of claim 1 wherein the envelope detector circuit, the analog LUT circuit, and the voltage processing circuit are integrated into an integrated circuit.

20. A power management integrated circuit (PMIC) comprising:
a target voltage circuit comprising:
an envelope detector circuit configured to detect a time-variant envelope of an analog signal, wherein the detected time-variant envelope is delayed from the time-variant envelope of the analog signal by a first temporal delay;
an analog look-up table (LUT) circuit configured to generate a target voltage based on the detected time-variant envelope of the analog signal, wherein the target voltage is delayed from the detected time-variant envelope of the analog signal by a second temporal delay; and
a voltage processing circuit configured to generate a modified target voltage that is time-adjusted relative to the time-variant envelope of the analog signal to substantially offset at least the first temporal delay and the second temporal delay; and
an envelope tracking integrated circuit (ETIC) configured to generate a time-variant voltage based on the modified target voltage for amplifying the analog signal.

* * * * *